United States Patent
Haller et al.

(10) Patent No.: US 9,506,986 B2
(45) Date of Patent: Nov. 29, 2016

(54) INTEGRATED CIRCUIT CHIP AND A METHOD FOR TESTING THE SAME

(71) Applicant: International Business Machines Corporation, Armonk, NY (US)

(72) Inventors: Wilhelm Haller, Remshalden (DE); Markus Kaltenbach, Holzgerlingen (DE); Ulrich Krauch, Dettenhausen (DE); Nicolas Maeding, Holzgerlingen (DE); Christian Zoellin, Weinstadt (DE)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 14/476,883

(22) Filed: Sep. 4, 2014

(65) Prior Publication Data
US 2015/0160293 A1   Jun. 11, 2015

(30) Foreign Application Priority Data
Dec. 6, 2013  (GB) .................................. 1321579.3

(51) Int. Cl.
*G01R 31/28* (2006.01)
*G01R 31/3185* (2006.01)

(52) U.S. Cl.
CPC ............. *G01R 31/318558* (2013.01); *G01R 31/318544* (2013.01)

(58) Field of Classification Search
None
See application file for complete search history.

(56) References Cited

U.S. PATENT DOCUMENTS

| | | | | |
|---|---|---|---|---|
| 5,333,139 A | * | 7/1994 | Sturges | G01R 1/31853 714/724 |
| 5,719,879 A | * | 2/1998 | Gillis | G01R 31/318558 365/201 |
| 6,490,702 B1 | * | 12/2002 | Song | G01R 31/318541 714/726 |
| 6,973,631 B2 | | 12/2005 | Huang et al. | |
| 7,058,869 B2 | * | 6/2006 | Abdel-Hafez | G01R 31/318591 714/726 |
| 7,185,251 B2 | * | 2/2007 | Moyer | G01R 31/318555 714/729 |
| 7,949,916 B1 | | 5/2011 | Ang | |
| 8,276,030 B2 | | 9/2012 | Whetsel | |
| 8,533,546 B1 | | 9/2013 | Ferguson et al. | |
| 9,222,978 B2 | | 12/2015 | Huang et al. | |
| 2003/0120987 A1 | | 6/2003 | Savaria et al. | |

(Continued)

FOREIGN PATENT DOCUMENTS

GB   2520991 A   6/2015

OTHER PUBLICATIONS

Zhang et al., "An Efficient Multiple Scan Chain Testing Scheme", 1996 IEEE, pp. 294-297.

(Continued)

*Primary Examiner* — Daniel McMahon
(74) *Attorney, Agent, or Firm* — L. Jeffrey Kelly

(57) ABSTRACT

An integrated circuit chip includes at least two integrated circuits, at least three scan chains, and a multiplexor circuitry. Each integrated circuit includes an integrated circuit input port and an integrated circuit output port. The scan chains and the integrated circuits are coupled by default with a series chain having integrated circuits and scan chains alternating each other. The series chain starts with an initial scan chain and ends with the end scan chain. Each scan chain except the initial one includes a first scan chain input port coupled by default with the integrated circuit output port of the respective adjacent integrated circuit. Each scan chain except the end one includes a first scan chain output port coupled by default with the integrated circuit input port of the respective adjacent integrated circuit.

16 Claims, 6 Drawing Sheets

(56) References Cited

U.S. PATENT DOCUMENTS

| | | |
|---|---|---|
| 2004/0015788 A1 | 1/2004 | Huang et al. |
| 2004/0148554 A1* | 7/2004 | Dervisoglu .... G01R 31/318335 714/727 |
| 2012/0233512 A1 | 9/2012 | Huang et al. |
| 2013/0163356 A1 | 6/2013 | Yanagida et al. |
| 2013/0173976 A1 | 7/2013 | Tekumalla et al. |
| 2013/0185607 A1 | 7/2013 | Tekumalla et al. |
| 2013/0185608 A1* | 7/2013 | Bhawmik ...... G01R 31/318508 714/727 |

OTHER PUBLICATIONS

Search report for application No. GB1321579.3, Dated Jun. 9, 2014, 3 pages.

* cited by examiner

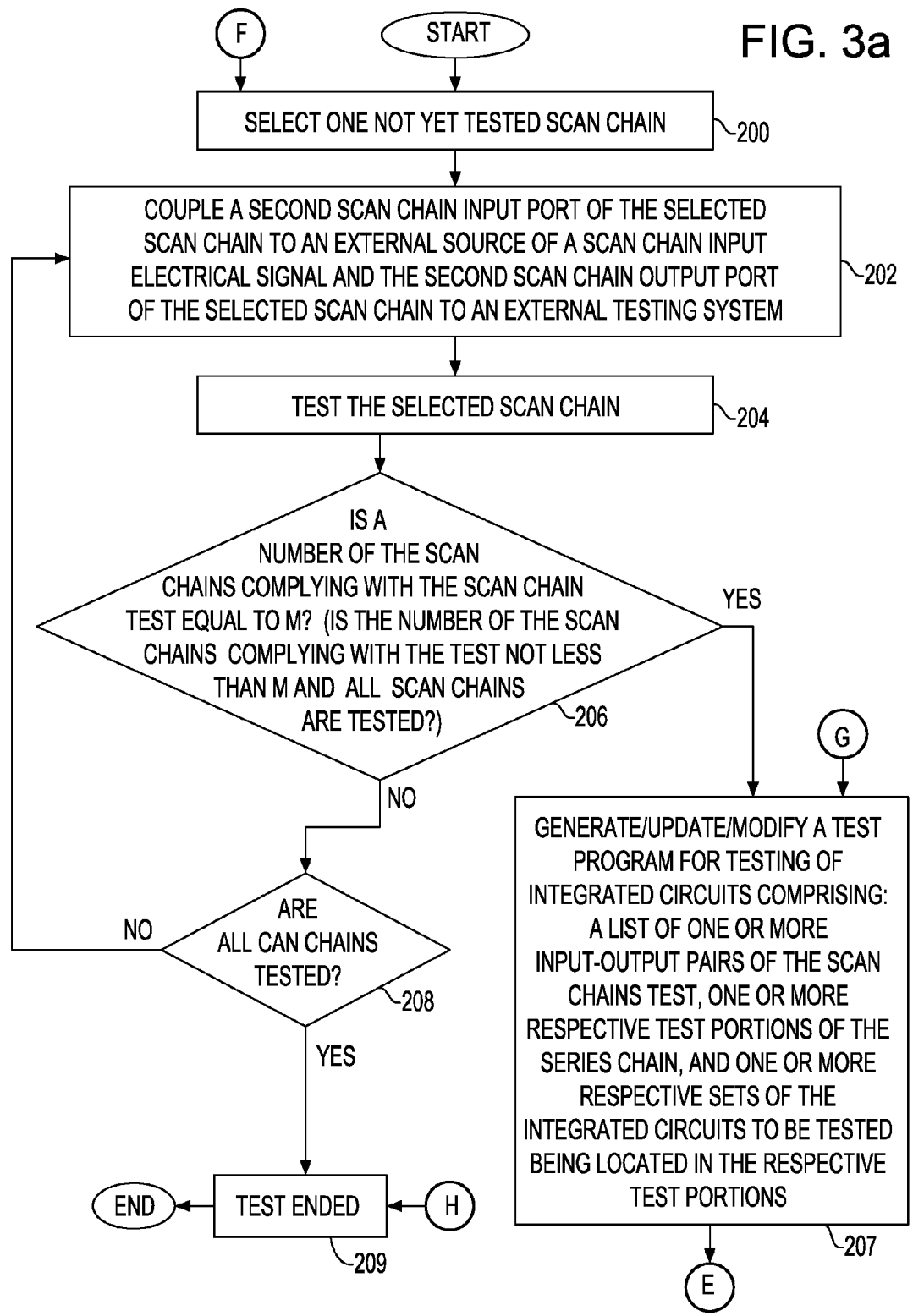

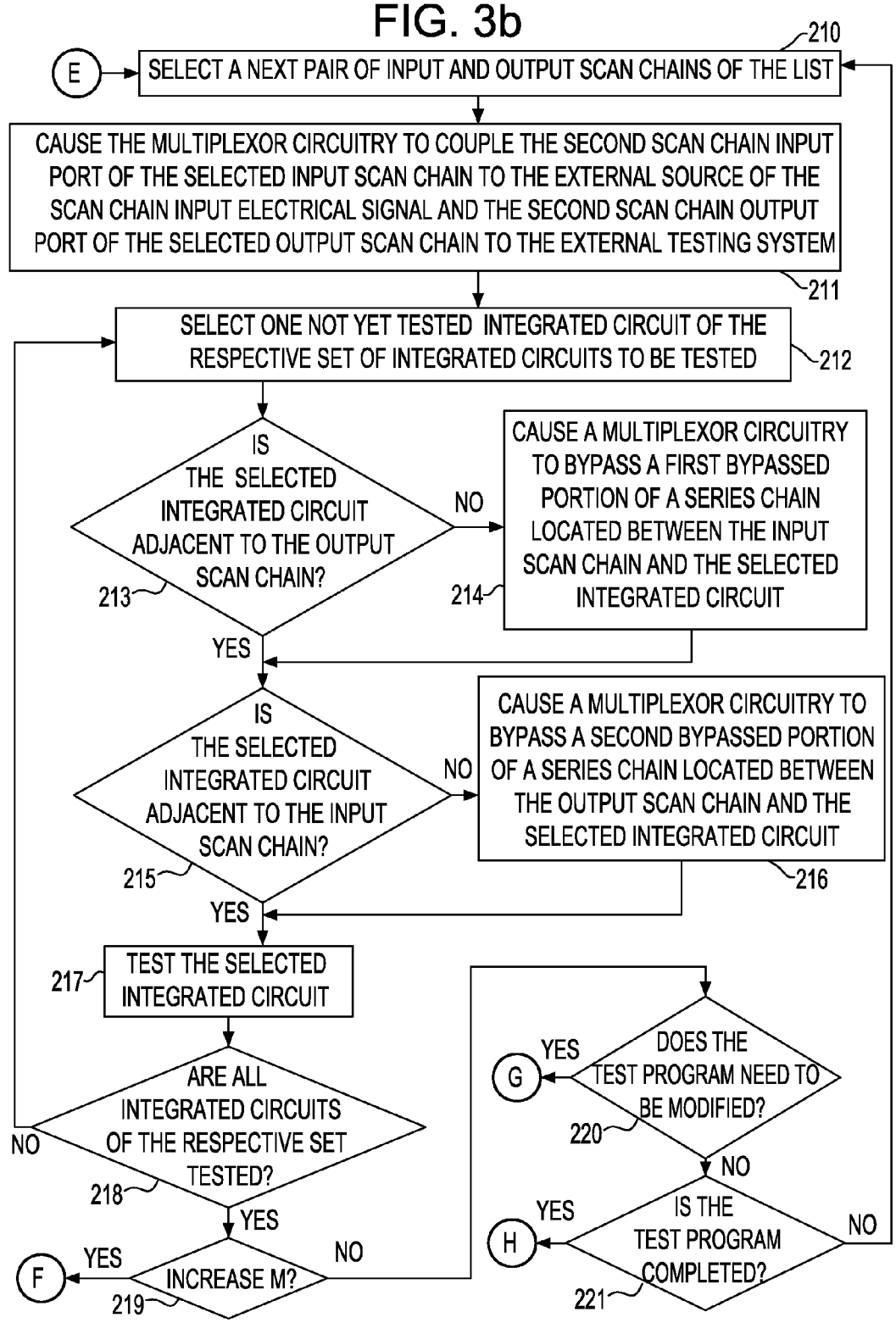

INTEGRATED CIRCUIT CHIP AND A METHOD FOR TESTING THE SAME

FIELD OF THE INVENTION

The present invention relates to the field of designed integrated circuit chips, and more specifically, to a method and a system for effectively testing of integrated circuit chips. More particularly, the present disclosure can be implemented in numerous ways, including a process, an apparatus, and a device.

BACKGROUND

Integrated circuit complexity has been increasing in accordance with Moore's law for several decades, approximately doubling the number of digital gates in a device every two years or less. This exponential rise in gate counts has resulted in rapidly escalating test complexity and cost. For instance, development of the 14 nm semiconductor manufacturing technology and other semiconductor technologies having even smaller critical dimensions requires electrical testing of a large amount of elements of circuitry such as digital logic structures, wiring at various levels, and the like electrical functioning of the elements is tested separately for each element and in conjunction with each other. Separate testing of the elements including relatively small amount of transistors and interconnects enables acquisition of electrical test data during early stage of the semiconductor manufacturing technology development when a defect density is high and as a consequence of this chances of having a defect free element including big amount of transistors and/or interconnects are low. In order to increase a volume of acquired electrical test data an auxiliary multiplexor circuitry is introduced in order to route test electrical signals between various elements and external test systems.

SUMMARY

The present disclosure provides embodiments that fill the need of effective testing of integrated circuit chips. It should be appreciated that the embodiments of the present disclosure can be implemented in numerous ways, including a process, an apparatus, a system, a method, or a device. Several inventive embodiments are described herein below.

In the following discussion, the term "coupled" is used to refer to components that are directly connected or are joined or linked by indirect connection. It should understood that the illustrated embodiments are for illustrative purposes only, and that direct connections illustrated within the b may include elements and/or intervening components that are not shown.

One embodiment provides an integrated circuit chip including at least two integrated circuits, at least three scan chains, and a multiplexor circuitry. Each integrated circuit includes an integrated circuit input port and an integrated circuit output port. The scan chains and the integrated circuits are coupled by default in a series chain having integrated circuits and scan chains alternating each other. The series chain begins with the initial scan chain and ends with the end scan chain. Each scan chain except the initial one includes a first scan chain input port coupled by default with the integrated circuit output port of the respective adjacent integrated circuit. Each scan chain except the end one includes a first scan chain output port coupled by default with the integrated circuit input port of the respective adjacent integrated circuit. The multiplexor circuitry operates for: bypassing any first portion of the series chain beginning with the first bypassed scan chain and ending with the last bypassed integrated circuit wherein the integrated circuit output port of the integrated circuit adjacent to the first bypassed scan chain is coupled with the first scan chain input port of the scan chain adjacent to the last bypassed integrated circuit and the first scan chain input port of the scan chain adjacent to the last bypassed integrated circuit is decoupled from the integrated circuit output port of the last bypassed integrated circuit; and bypassing any second portion of the series chain beginning with the first bypassed integrated circuit and ending with the last bypassed scan chain wherein the integrated circuit input port of the integrated circuit adjacent to the last bypassed scan chain is coupled with the first scan chain output port of the scan chain adjacent to the first bypassed integrated circuit and the integrated circuit input port of the integrated circuit adjacent to the last bypassed scan chain is decoupled from the first scan chain output port of the last bypassed scan chain.

In another embodiment, the integrated circuit chip further includes one more integrated circuit looping the series chain into a looped chain. The initial scan chain further includes the first scan chain input port by default coupled with the integrated circuit output port of the one more integrated circuit. The end scan chain further includes the first scan chain output port by default coupled with the integrated circuit input port of the one more integrated circuit.

In yet another embodiment, each scan chain further includes a second scan chain input port and a second scan chain output port. Each scan chain operates by generating a scan chain output electrical signal on the second scan chain output port of the scan chain in response to receiving a scan chain input electrical signal on the second scan chain input port of the scan chain. Each integrated circuit operates by generating an output integrated circuit electrical signal on the integrated circuit output port of the integrated circuit in response to receiving an input integrated circuit electrical signal on the input port of the integrated circuit. Each scan chain except the end one is further operated for generating the input integrated circuit electrical signal on the first scan chain output port of the scan chain in the response to the receiving the scan chain input electrical signal on the second scan chain input port of the scan chain. Each scan chain except the initial one is further operated for generating of a processed integrated circuit output electrical signal on the second scan chain output port of the scan chain in response to receiving of the output integrated circuit electrical signal on the first scan chain input port of the scan chain.

In yet another embodiment, each scan chain further includes a second scan chain input port and a second scan chain output port. Each scan chain operates by generating a scan chain output electrical signal on the second scan chain output port of the scan chain in response to receiving a scan chain input electrical signal on the second scan chain input port of the scan chain. Each integrated circuit operates by generating an output integrated circuit electrical signal on the integrated circuit output port of the integrated circuit in response to receiving an input integrated circuit electrical signal on the input port of the integrated circuit. Each scan chain is further operated for generating the input integrated circuit electrical signal on the first scan chain output port of the scan chain in the response to the receiving the scan chain input electrical signal on the second scan chain input port of the scan chain. Each scan chain is further operated for generating of a processed integrated circuit output electrical signal on the second scan chain output port of the scan chain in response to receiving of the output integrated circuit electrical signal on the first scan chain input port of the scan chain.

In yet another embodiment, each integrated circuit input port of any integrated circuit except the integrated circuit adjacent to the initial scan chain is coupled by default with the first scan chain output port of the scan chain adjacent to any integrated circuit except the integrated circuit adjacent to the initial scan chain by way of a respective input multiplexor in a default state of the respective input multiplexor, each input multiplexor in a bypass state of each input multiplexor decouples the integrated circuit input port of the respective integrated circuit from the first scan chain output port of the respective scan chain adjacent to the respective integrated circuit and couples it to the first scan chain output port of another scan chain adjacent to another integrated circuit, wherein the another integrated circuit and the respective integrated circuit are adjacent to the respective scan chain.

In another aspect of the disclosure, bypassing a second portion is performed by switching all input multiplexors of a respective second set of the input multiplexors into the bypass state, wherein each first scan chain output port of the respective bypassed scan chain of any second portion is coupled by way of the respective input multiplexor of the respective second set with the respective integrated circuit input port of the integrated circuit adjacent to the respective bypassed scan chain in the default state of the respective input multiplexor.

Each integrated circuit output port of any integrated circuit except the integrated circuit adjacent to the initial scan chain is coupled by default with the first scan chain input port of the scan chain adjacent to any integrated circuit except the integrated circuit adjacent to the initial scan chain by way of a respective output multiplexor in a default state of the respective output multiplexor, each output multiplexor in a bypass state of each output multiplexor decouples the first scan chain input port of the respective scan chain from the integrated circuit output port of the respective integrated circuit adjacent to the respective scan chain and couples it to the integrated circuit output port of another integrated circuit adjacent to another scan chain, wherein the another integrated circuit and the respective integrated circuit are adjacent to the another scan chain.

In an aspect of the disclosure, bypassing a first portion is achieved by switching all output multiplexors of a respective first set of the output multiplexors into the bypass state, wherein each integrated circuit output port of the respective bypassed integrated circuit of the first portion is coupled to the respective output multiplexor of the respective first set with the respective first scan chain input port of the respective scan chain adjacent to the respective bypassed integrated circuit in default state of the respective output multiplexor.

In another aspect, each integrated circuit input port of the integrated circuit is coupled by default with the first scan chain output port of the scan chain adjacent to the integrated circuit excepting the integrated circuit adjacent to the initial scan chain by way of a respective input multiplexor in default state of the respective input multiplexor, each input multiplexor in bypass state of each input multiplexor decouples the integrated circuit input port of the respective integrated circuit from the first scan chain output port of the respective scan chain adjacent to the respective integrated circuit, couplings it to the first scan chain output port of another scan chain adjacent to another integrated circuit, wherein the another integrated circuit and the respective integrated circuit are adjacent to the respective scan chain.

The bypassing of a second portion is performed by switching all the input multiplexors of a respective second set of the input multiplexors into the bypass state, wherein each first scan chain output port of the respective bypassed scan chain of the second portion is coupled to the respective input multiplexor of a respective second set with the respective integrated circuit input port of the integrated circuit adjacent to the respective bypassed scan chain in default state of the respective input multiplexor.

In yet another aspect, each integrated circuit output port of an integrated circuit is coupled by default with the first scan chain input port of the scan chain adjacent to any integrated circuit except the integrated circuit adjacent to the initial scan chain by way of a respective output multiplexor in default state of the respective output multiplexor, each output multiplexor in the bypass state of each output multiplexor decouples the first scan chain input port of the respective scan chain from the integrated circuit output port of the respective integrated circuit adjacent to the respective scan chain and couples it to the integrated circuit output port of another integrated circuit adjacent to another scan chain, wherein the other integrated circuit and respective integrated circuit are adjacent to another scan chain.

Furthermore, the bypassing of a first portion is performed by switching all output multiplexors of a respective first set of the output multiplexors into the bypass state, wherein each integrated circuit output port of the respective bypassed integrated circuit of the first portion is coupled to the respective output multiplexor of the respective first set with the respective first scan chain input port of the respective scan chain adjacent to the respective bypassed integrated circuit in default state of the respective output multiplexor.

In still another aspect, the integrated circuit chip further includes an input and output terminal for coupling of the integrated circuit chip with external electronic devices. The multiplexor circuitry further operates coupling the input terminal with a second scan chain input port; and coupling the output terminal with a second scan chain output port.

In a further aspect, the second scan chain input port of the initial scan chain is coupled with the input terminal. Each second scan chain input port of any scan chain except the initial one is coupled by default with the second scan chain output port of the respective scan chain to a respective signal multiplexor in a default state of the respective signal multiplexor and each second scan chain input port of a scan chain except the initial one decoupled from the second scan chain output port of the respective scan chain and coupled to the second scan chain input port of the respective scan chain by the respective signal multiplexor in bypass state of the respective signal multiplexor, wherein the first scan chain output port of any scan chain is coupled by default with the integrated circuit input port of the integrated circuit adjacent to the respective scan chain.

Moreover the output terminal is coupled by default with the second scan chain output port of the end scan chain by an additional signal multiplexor in default state of the additional signal multiplexor, the additional signal multiplexor in bypass state of the additional signal multiplexor decouples the output terminal from the second scan chain output port of the end scan chain and couples it with the second scan chain input port of the end scan chain.

Still further, the coupling of the input terminal with a second scan chain input port except the second scan chain input port of the initial scan chain is performed by switching a respective third set of the signal multiplexors into the bypass state, wherein each signal multiplexor of the respective third set couples when in default state the respective second scan chain input port of the scan chain of the fifth set with the respective second scan chain output port of the scan chain of the fifth set, wherein the fifth set includes the initial scan chain, the scan chain including a second scan chain input port, and all the scan chains located in the series chain between the initial scan chain and the scan chain including any second scan chain input port.

Coupling the output terminal with a second scan chain output port except the second scan chain output port of the end scan chain is performed by switching a respective fourth set of the signal multiplexors in bypass state, wherein the fourth set includes the additional signal multiplexor, and all signal multiplexors coupling in default state the respective first scan chain input and output ports of the scan chains located in the series chain between the end scan chain and the scan chain including any second scan chain output port.

In yet another aspect, the integrated circuit input ports, the integrated circuit output ports, the first scan chain output ports, and the first scan chain input ports are parallel ports and the first scan chain input and output ports are serial ports.

In still another aspect, an embodiment provides a method for testing integrated circuit chip including at least two integrated circuits, at least three scan chains, and multiplexor circuitry. Each integrated circuit includes an integrated circuit input port and an integrated circuit output port. The scan chains and integrated circuits are coupled by default in a series chain having integrated circuits and scan chains alternating each other. The series chain begins with the initial scan chain and ends with the end scan chain. Each scan chain except the initial one includes a first scan chain input port coupled by default with the integrated circuit output port of the respective adjacent integrated circuit. Each scan chain, except the end one, includes a first scan chain output port coupled by default with the integrated circuit input port of the respective adjacent integrated circuit. The method includes: a next input-output pair consisting of two scan chains generated with the first scan chain output port of the input scan chain of the next input-output pair is coupled by default with the integrated circuit input port of the integrated circuit adjacent to the input scan chain, and the integrated circuit adjacent to the input scan chain is the integrated circuit of the next test portion of the series chain between the input and output scan chains of the next input-output pair, and the first scan chain input port of the output scan chain of the next input-output pair is coupled by default with the integrated circuit output port of the integrated circuit adjacent to the output scan chain, wherein the integrated circuit adjacent to the output scan chain is the integrated circuit of the next test portion.

One or more integrated circuits of the next test portion are sequentially organized for an integrated circuit test, wherein each integrated circuit under the integrated circuit test has the integrated circuit output port coupled with the first scan chain input port of the output scan chain of the next input-output pair and the integrated circuit input port coupled with the first scan chain output port of the input scan chain of the next input-output pair. The sequentially organized one or more integrated circuits of the next test portion is performed by causing the multiplexor circuitry to perform: in a case when the integrated circuit under the integrated circuit test is not adjacent to the output scan chain of the next input-output pair a first portion of the series chain located between the output scan chain and the integrated circuit under the integrated circuit test bypassed, wherein the first scan chain input port of the output scan chain is coupled with the integrated circuit output port of the integrated circuit under the integrated circuit test and the first scan chain input port of the output scan chain decoupled from the integrated circuit output port of the integrated circuit adjacent to the output scan chain.

In a case when the integrated circuit under the integrated circuit test is not adjacent to the input scan chain of the next input-output pair a second portion of the series chain located between the input scan chain and the integrated circuit test is bypassed when the first scan chain output port of the input scan chain is coupled with the integrated circuit input port of the integrated circuit under the integrated circuit test and the integrated circuit input port of the integrated circuit test decoupled from the first scan chain output port of the scan chain adjacent to the integrated circuit.

In yet another embodiment each scan chain includes a second scan chain input port and a second scan chain output port, including putting the scan chains to a scan chain test in order to identify at least two scan chains complying with the scan chain test until either at least two scan chains complying with the scan chain test are identified or all the scan chains are tested by putting them to the scan chain test. Each scan chain operated for generating a scan chain output electrical signal on the second scan chain output port of the scan chain in response to receiving a scan chain input electrical signal on the second scan chain input port of the scan chain. Forming scan chains to the scan chain test is performed by coupling the second scan chain input port of the scan chain under the scan chain test with an external source of the scan chain input electrical signal and the second scan chain output port of the scan chain under the scan chain test with an external testing system operated for determining whether the scan chain complies with the scan chain test on a basis of the received scan chain output electrical signal of the scan chain. Generating the next input output pair is performed using only the scan chains complying with the scan chain test.

In yet another embodiment each integrated circuit operates by generating an output integrated circuit electrical signal on the integrated circuit output port of the integrated circuit in response to receiving an input integrated circuit electrical signal on the input port of the integrated circuit. Each scan chain complying with the scan chain test except the end one is further operated for generating the input integrated circuit electrical signal on the first scan chain output port of the scan chain in the response to receiving the scan chain input electrical signal on the first scan chain input port of the scan chain. Each scan chain complying with the scan chain test except the initial one is further operated for generating of a processed integrated circuit output electrical signal on the second scan chain output port of the scan chain in response to receiving of the output integrated circuit electrical signal on the first scan chain input port of the scan chain. A method further includes prior to the sequentially arrangement of one or more integrated circuits of the next test portion to the integrated circuit test coupling the second scan chain input port of the input scan chain of the next input-output pair with the external source of the scan chain input electrical signal and the second scan chain output port of the output scan chain of the next input-output pair with the external testing system. The external testing system is further operated for registering the processed integrated circuit output electrical signal of the scan chain having first scan chain input port coupled with the integrated circuit output port of the integrated circuit under the integrated circuit test. The sequentially putting of one or more integrated circuits of the next test portion to the integrated circuit test includes: registering by the external testing system of the integrated circuit output electrical signal of the scan chain having first scan chain input port coupled with the integrated circuit output port of the integrated circuit under the integrated circuit test.

In yet another embodiment the integrated circuit chip further includes one more integrated circuit of the series chain looping the series chain into a looped chain. The initial scan chain further includes the first scan chain input port by default coupled with the integrated circuit output port of the one more integrated circuit. The end scan chain further includes the first scan chain output port by default coupled with the integrated circuit input port of the one more integrated circuit. The end scan chain is further operated for generating the input integrated circuit electrical signal on the first scan chain output port of the scan chain in the response to the receiving the scan chain input electrical signal on the second scan chain input port of the scan chain. The initial scan chain is further operated for generating of the processed integrated circuit output electrical signal on the second scan chain output port of the scan chain in response to receiving of the output integrated circuit electrical signal on the first scan chain input port of the scan chain.

In yet another embodiment the second scan chain output port of at least one scan chain under the scan chain test is coupled with the external testing system by way of a second set of the scan chains under the scan chain test and/or the second scan chain input port of the at least one scan chain under the scan chain test is coupled with the external source of the scan chain input electrical signal by way of a first set of the scan chains under the scan chain test. Each scan chain except the initial one is further operated for generating the scan chain output electrical signal on the second scan chain output port of the scan chain in response to receiving the scan chain output electrical signal on the second scan chain input port of the scan chain.

The at least one scan chain under the scan chain test and all the scan chains of the second set of the scan chains are coupled sequentially in a second auxiliary series chain of the scan chains under the scan chain test by way of a second respective number of coupled pairs of the second scan chain input and output ports of the scan chains adjacent to each other in the second auxiliary series chain, wherein the second auxiliary series chain begins with the at least one scan chain under the scan chain test having second scan chain output port coupled with the second scan chain input port of the scan chain adjacent to the at least one scan chain under the scan chain test in the second auxiliary series chain, wherein the second auxiliary series chain ends with the scan chain of the second set of the scan chains having second scan chain output port coupled with the external testing system, wherein the external test system is further operated for testing all the scan chains in the second auxiliary series chain simultaneously and determining whether all the scan chains in the second auxiliary series chain comply with the scan chain test.

At least one scan chain under the scan chain test and all the scan chains of the first set of the scan chains are coupled sequentially in a first auxiliary series chain of the scan chains under the scan chain test by way of a first respective number of coupled pairs of the second scan chain input and output ports of the scan chains adjacent to each other in the first auxiliary series chain, wherein the first auxiliary series chain ends with the at least one scan chain under the scan chain test having second scan chain input port coupled with the second scan chain output port of the scan chain adjacent to the at least one scan chain under the scan chain test in the first auxiliary series chain, wherein the first auxiliary series chain begins with the scan chain of the first set of the scan chains having second scan chain input port coupled with the external source of the scan chain input electrical signal, wherein the external test system is further operated for testing all the scan chains in the first auxiliary series chain simultaneously and determining whether all the scan chains in the first auxiliary series chain comply with the scan chain test.

In yet another embodiment the method further includes repeating one or more times the generating of the next input-output pair consisting of two scan chains and the sequentially putting of the one or more integrated circuits of the next test portion to an integrated circuit test, wherein each next input-output pair is generated wherein the next respective test portion includes at least one integrated circuit, which was not yet tested using each next input-output pair.

In a case when not all the scan chains are tested, the method further includes before the generating of the next input-output pair further testing of all not yet tested scan chains in order to identify all the scan chains complying with the scan chain test.

DESCRIPTION OF THE DRAWINGS

The present disclosure will be readily understood by the following detailed description in conjunction with the accompanying drawings; in which:

FIGS. 3a-3b are flowcharts of process blocks for testing the integrated circuit chips.

DETAILED DESCRIPTION

Figure 1A:
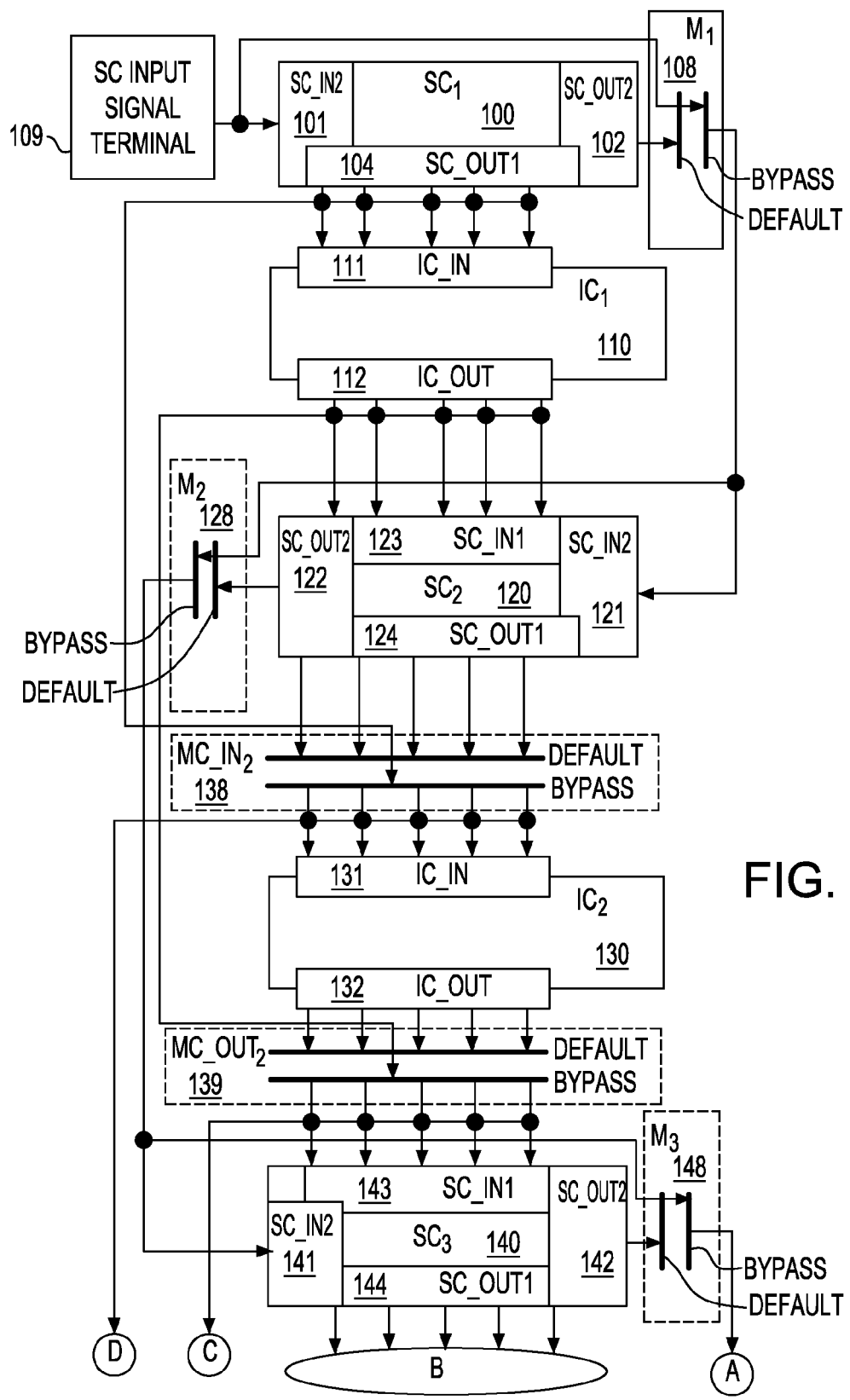
FIGS. 1a-1b are block diagrams of a first integrated circuit chip.

One of the main requirements for effective testing semiconductor chips may be formulated as follows. Testing procedures of semiconductor chips on a semiconductor wafer have to be optimized wherein data acquisition time and area of the semiconductor wafer used for auxiliary test structures required for data acquisition are minimized. The latter two requirements are substantially contradictory. Reduction in data acquisition time may be performed by increase in a number of data channels simultaneously used for data acquisition. The increase in the number of the data channels is implemented as usual by an increase in a number and/or size of the auxiliary test structures. As a result, the area of the semiconductor wafer used for auxiliary test structures is increased. Yet another requirement for effective testing of semiconductor chips is determined by maturity of semiconductor technology used for the manufacturing of semiconductor chips. Typically, every semiconductor technology and device has three phases of development: R&D, Ramp-Up, and manufacturing. The evolution is generally characterized by a gradual decrease in the defect density, an increase in yield, and a reduction in data volume acquired for testing of semiconductor chips. For instance, since defect density is significantly low during the manufacturing phase, the data volume acquired for testing of the semiconductor chip is also low, with even the number of semiconductor chips tested may be very low. On the contrary, during R&D phase the data volume acquired for testing is very high, since a lot of chips have malfunctions due to a high defect density.

The detailed description, addresses a problem providing illustrative auxiliary test structures for testing integrated circuits chips and extending to a semiconductor wafer. The auxiliary test structures use a small area of the semiconductor wafer and provide an excellent flexibility in terms of execution of various test patterns. As a result thereof, the auxiliary test structures may be utilized not only during the R&D phase, but also during other phases such as manufacturing and Ramp-Up.

The concept and the technologies described hereinafter may be used in an apparatus referenced as a logic defect monitor (LDM). As usual, LDM tests a plurality of integrated circuits on a single chip. In the context of the present application, integrated circuits are often referred to as circuits under test (CUT). The CUTs are coupled with external test/acquisition systems and sources of external electrical signals by way of auxiliary test structures. The auxiliary test structures may, but are not limited to scan chains, registers, buffers, and multiplexors. The main purpose of the auxiliary test structures is to provide a flexible/programmable coupling between different integrated circuits, the auxiliary test structures, the external test/acquisition systems, and sources of external electrical signals. For instance, scan chains may be used to fan-out a test signal coupled with a chip by way of (serial and/or parallel) I/O ports of the chip to (parallel and/or serial) I/O ports of the integrated circuits. Scan chains may be further used to couple signals generated at the (parallel and/or serial) I/O ports of the integrated circuits with serial (parallel and/or serial) I/O ports of external test systems.

Figure 1B:
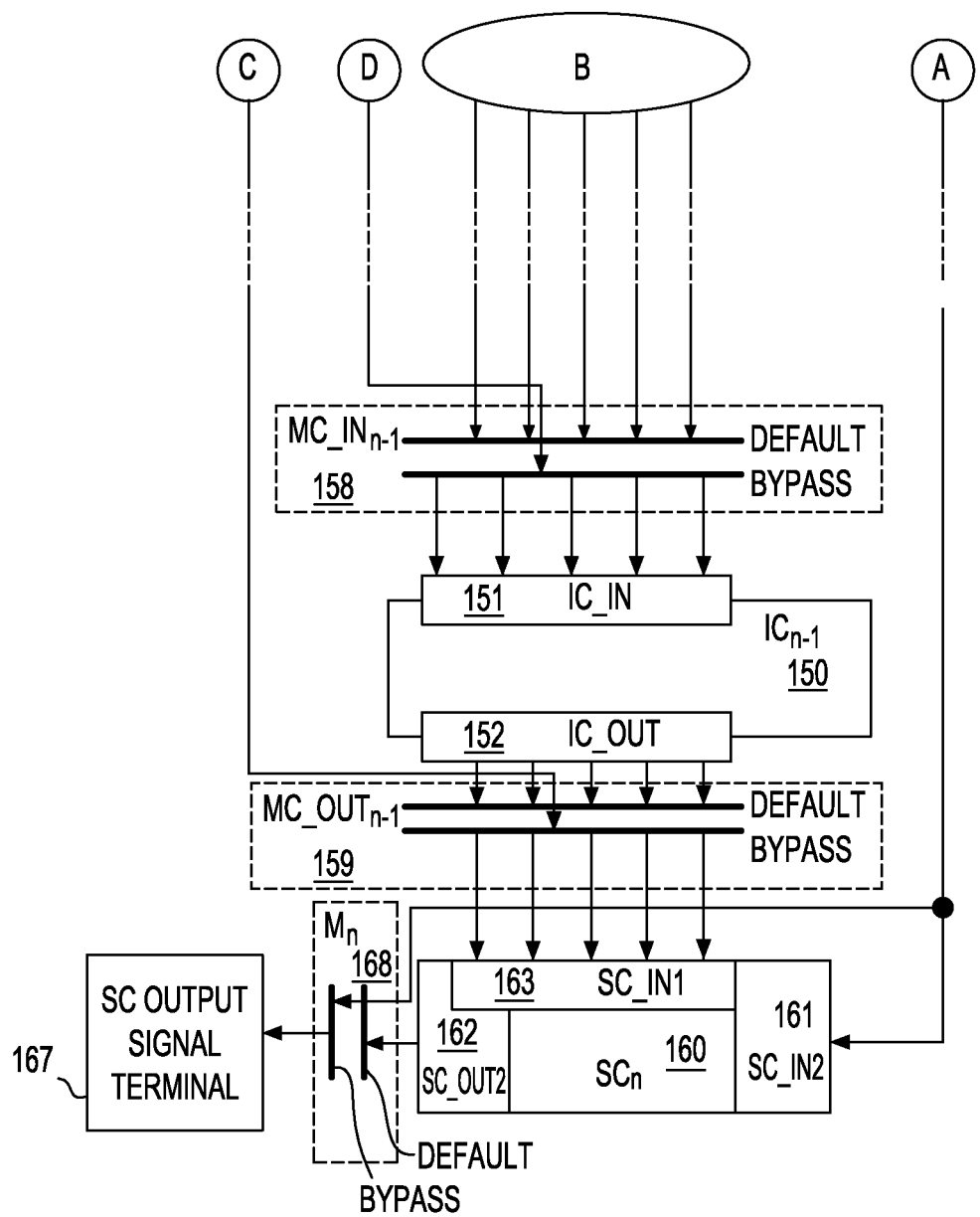

Referring to FIGS. 1a and 1b, circuit diagrams are provided of a first illustrative integrated circuit chip including n−1 integrated circuits $IC_1$-$IC_{n-1}$ 110, 130, 150, n scan chains $SC_1$-$SC_n$ 100, 120, 140, 160, and a multiplexor circuitry $M_1$-$M_n$, $MC\_IN_2$-$MC\_IN_{n-1}$, $MC\_OUT_2$-$MC\_OUT_{n-1}$, 108, 128, 138, 139, 148, 158, 159, wherein n is an integer number greater than 2. Each integrated circuit includes an integrated circuit input port IC_IN 111, 131, 151 and an integrated circuit output port IC_OUT 112, 132, 152. The scan chains and the integrated circuits are coupled by default to a series chain having integrated circuits and scan chains alternating each other. The series chain begins with the initial scan chain $SC_1$ 100 (FIG. 1a), ending at the end scan chain $SC_n$ 160 (FIG. 1b). Each scan chain except the initial one includes a first scan chain input port SC_IN1 123, 143, 163 coupled by default with the integrated circuit output port IC_OUT of the respective adjacent integrated circuit. Each scan chain except the end one including a first scan chain output port SC_OUT1 104, 124, 144 coupled by default with the integrated circuit input port IC_IN of the respective adjacent integrated circuit. For illustrative purposes, the integrated circuits and the scan chains are numbered in the series chain in correspondence with their respective coupling. The initial scan chain 100 has the number 1 and is referenced on the FIG. 1a as $SC_1$. The integrated circuit 110 adjacent to $SC_1$ have the integrated circuit input port IC_IN 111 coupled by default with the initial scan chain 100 output port SC_OUT1 104 has the number 1 and referred to as $IC_1$. The $IC_1$ has further integrated circuit output port IC OUT 112 coupled by default with the first scan chain input port SC_IN1 123 of the scan chain having the number 2 and is referenced to as $SC_2$ 120 in FIG. 1a. The end scan chain has a number n and is referenced on FIG. 1b as $SC_n$. The $SC_n$ has the first scan chain input port SC_IN1 163 coupled by default with the integrated circuit output port IC_OUT of the integrated circuit having the number n−1 and is referenced on FIG. 1n as $IC_{n-1}$. The aforementioned default coupling of the scan chains and the integrated circuits can be formulated using the above introduced numbering as follows: the integrated circuit $IC_i$ has the input integrated circuit port IC_IN coupled by default with the first scan chain output port SC_OUT1 of the scan chain $SC_i$ and the output integrated circuit port IC_OUT coupled by default with the first scan chain input port SC_IN2 of the scan chain $SC_{i+1}$, wherein 0<i<n.

Each integrated circuit input port of an integrated circuit except the integrated circuit adjacent to the initial scan chain is coupled by default with the first scan chain output port of the scan chain adjacent to any integrated circuit except the integrated circuit adjacent to the initial scan chain by way of a respective input multiplexor ($MC\_IN_2$-$MC\_IN_{n-1}$) 138, 158 in a default state of the respective input multiplexor. Each input multiplexor in a bypass state of each input multiplexor decouples the integrated circuit input port of the respective integrated circuit from the first scan chain output port of the respective scan chain adjacent to the respective integrated circuit and couples it to the first scan chain output port of another scan chain adjacent to another integrated circuit, wherein the another integrated circuit and the respective integrated circuit are adjacent to the respective scan chain. For instance, in the default state the MC_IN2 couples SC_OUT1 of $SC_2$ with the CUT_IN of the $IC_2$ adjacent to the $SC_2$ and in the bypass state the MC_IN2 decouples the IC_IN of $IC_2$ from the SC_OUT1 of $SC_2$ and couples it with the SC_OUT2 of the $SC_1$ adjacent to the $IC_1$, wherein $IC_1$ and $IC_2$ are adjacent to $SC_2$. For illustrative purposes, the input multiplexors are numbered in conjunction with the numeration of the integrated circuits, i.e. each input multiplexor having the same number as the respective integrated circuit having the integrated circuit input port coupled by default by way of each input multiplexor with the first scan chain output port of the scan chain adjacent to the integrated circuit. Using the numbering of the input multiplexors the coupling of the integrated circuits input ports with the first scan chain output ports can be formulated as follows: the input multiplexor $MC\_IN_i$ couples the integrated circuit input port IC_IN of the $IC_i$ with the first scan chain output port SC_OUT1 of the $SC_i$ in the default state of the input multiplexor $MC\_IN_i$, the input multiplexor $MC\_IN_i$ decouples the integrated circuit input port IC_IN of $Ic_y$ from the first scan chain output port of the $SC_i$ and couples it with the first scan chain output port of the $SC_{i-1}$ in bypass state of the input multiplexor $MC\_IN_i$, wherein 1<i<n.

Each integrated circuit output port of any integrated circuit except the integrated circuit adjacent to the initial scan chain is coupled by default with the first scan chain input port of the scan chain adjacent to any integrated circuit except the integrated circuit adjacent to the initial scan chain by way of a respective output multiplexor ($MC\_OUT_2$-$MC\_OUT_{n-1}$) 139, 159 in a default state of the respective output multiplexor. Each output multiplexor in a bypass state of each output multiplexor decouples the first scan chain input port of the respective scan chain from the integrated circuit output port of the respective integrated circuit adjacent to the respective scan chain and couples it to the integrated circuit output port of another integrated circuit adjacent to another scan chain, wherein the 'another integrated circuit' and the respective integrated circuit are adjacent to the another scan chain. For instance, in the default state the MC_OUT2 couples the SC_IN1 of the $SC_3$ with the IC_OUT of the $IC_2$ adjacent to the $SC_3$ and in the bypass state the MC_OUT2 decouples the SC_IN1 of the $SC_3$ from the IC_OUT of the $IC_2$ and further couples it with the IC_OUT of the $IC_1$ adjacent to the $SC_2$, wherein the $IC_1$ and the $IC_2$ are adjacent to $SC_2$. For illustrative purposes, the output multiplexors are numbered in conjunction with the numeration of the integrated circuits, i.e., each output multiplexor has the same number as the respective integrated circuit having the integrated circuit output port coupled by default by way of each output multiplexor with the first scan chain input port of the scan chain adjacent to the respective integrated circuit. Using the numbering of the output multiplexors the coupling of the integrated circuits output ports with the first scan chain input ports can be formulated as follows: the output multiplexor $MC\_OUT_i$ couples the integrated circuit output port IC_OUT of the $IC_i$ with the first scan chain input port SC_IN1 of the $SC_{i+1}$ in the default state of the output multiplexor $MC\_OUT_i$, the output multiplexor $MC\_OUT_i$ decouples the first scan chain input port SC_IN1 of the $SC_{i+1}$ from the integrated circuit output port IC_OUT of the $IC_i$ and couples it to the integrated circuit output port IC_OUT of the $IC_{i-1}$ in the bypass state of the output multiplexor $MC\_OUT_i$, wherein $1<i<n$.

Each scan chain includes a respective second scan chain input port SC_IN2 101, 121, 141, 161 and a respective second scan chain output port SC_OUT2 102, 122, 142, 162 (FIG. 1*a*). The second scan chain input port 101 of the initial scan chain 100 is coupled with the input terminal 109 of the integrated circuit. Each second scan chain input port of any scan chain except the initial one is coupled by default with the second scan chain output port of the respective scan chain by way of a respective signal multiplexor $M_1$-$M_{n-1}$ 108, 128, 148 in a default state of the respective signal multiplexor and each second scan chain input port of any scan chain except the initial one is decoupled from the second scan chain output port of the respective scan chain and coupled to the second scan chain input port of the respective scan chain by the respective signal multiplexor in a bypass state of the respective signal multiplexor, wherein the first scan chain output port of any scan chain is coupled by default with the integrated circuit input port of the integrated circuit adjacent to the respective scan chain. The output terminal 167 of the first integrated circuit chip is coupled by default with the second scan chain output port 162 of the end scan chain by way of an additional signal multiplexor 168 in a default state of the additional signal multiplexor. The additional signal multiplexor 168 in a bypass state of the additional signal multiplexor decouples the output terminal from the second scan chain output port of the end scan chain and couples it with the second scan chain output port of the end scan chain. For instance, in the default state, the data signal multiplexor $M_2$ couples the second scan chain output port SC_OUT2 of the $SC_2$ with the SC_IN2 of the $SC_3$, wherein the SC_OUT1 of the $SC_2$ is coupled by default with the IC_IN of the $IC_2$ adjacent to the $SC_3$; and in the bypass state the $M_2$ decouples SC_IN2 of $SC_3$ from SC_OUT2 of $IC_2$ and couples it with SC_IN2 of $IC_2$. For illustrative purposes, the signal multiplexors are numbered in conjunction with the numeration of the integrated circuits, i.e., each signal multiplexor has the same number as the respective scan chain, and having the second scan chain output port coupled by default by way of each signal multiplexor with either second scan chain input port of another scan chain (in a case when the respective scan chain is not the end scan chain) or the output terminal (in the case when the respective scan chain is the end scan chain). Using the numbering of the signal multiplexors the coupling of the second scan chain input and out ports and the output terminal can be formulated as follows: in the default state the signal multiplexor $M_i$ couples the second scan chain output port SC_OUT2 of the $SC_i$ with the second scan chain input port SC_IN2 of the in the bypass state the signal multiplexor $M_i$ decouples the second scan chain input port SC_IN2 of $SC_{i+1}$ from the second scan chain output port SC_OUT2 of the $SC_i$ and couples it with the second scan chain input port SC_IN2 of $SC_i$, wherein $0<i<n$; the input terminal is coupled with the second scan chain input port $SC_1$; in the default state the signal multiplexor $M_n$ couples the second scan chain output port SC_OUT2 of $SC_n$ with the output terminal and in the bypass state the signal multiplexor $M_n$ decouples the output terminal from the second scan chain output port SC_OUT2 of $SC_n$ and couples it with the second scan chain input port SC_IN2 of the $SC_n$.

Figure 2A:
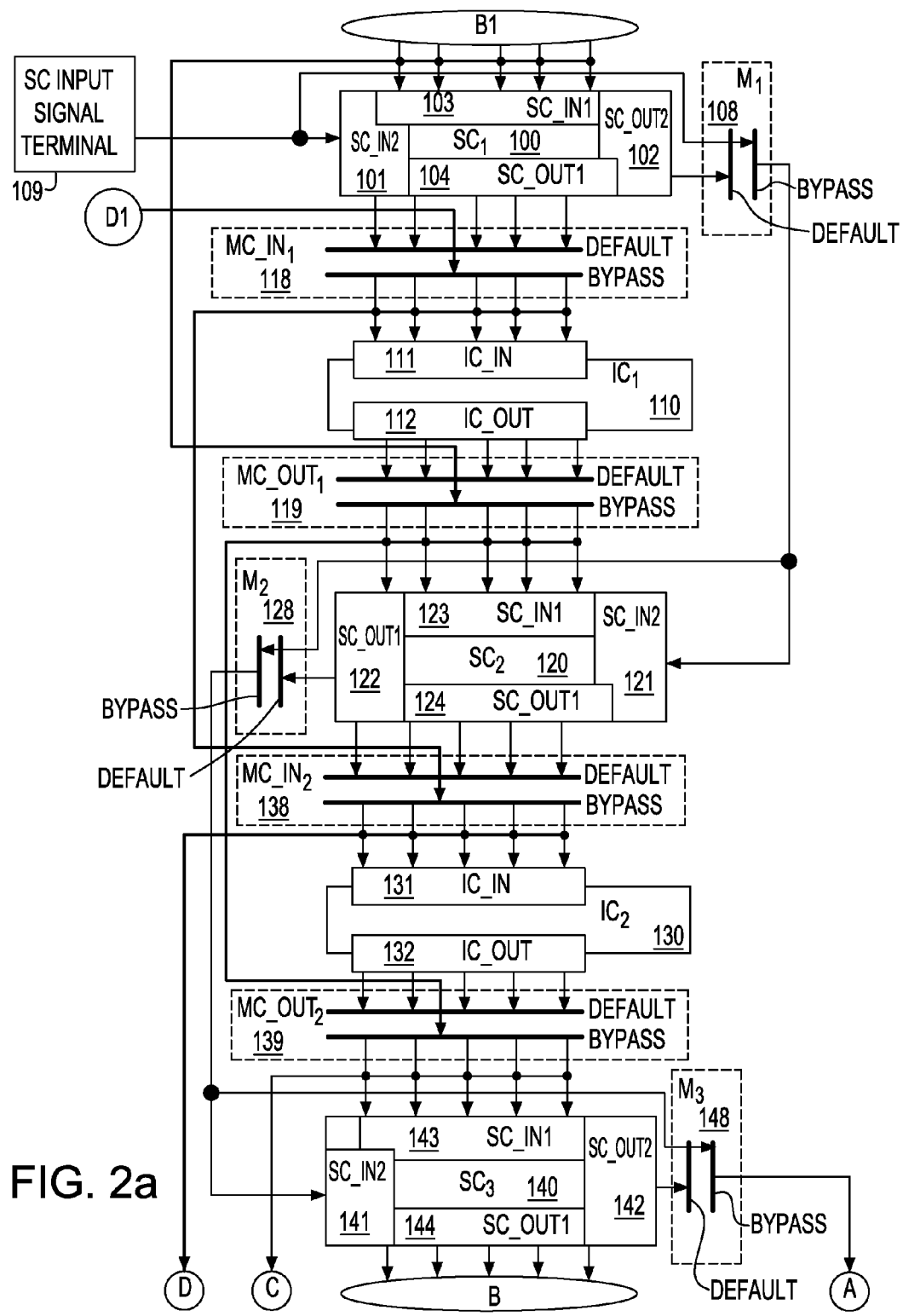
FIGS. 2a-2b are block diagrams of a second integrated circuit chip.
Figure 2B:
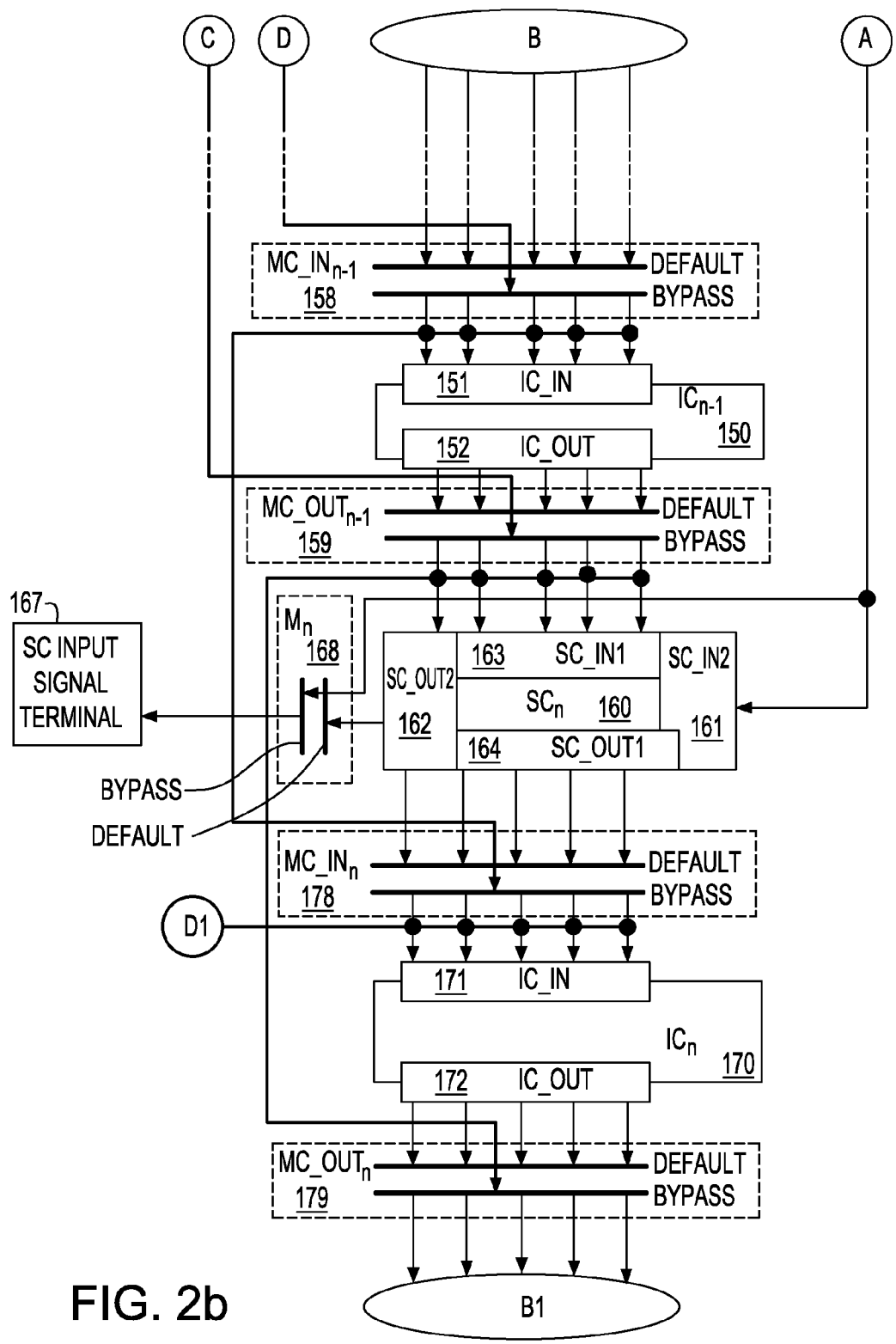

FIG. 2*b* illustrates another circuit diagram of a second integrated circuit chip having the following additional elements in comparison with the first integrated circuit chip: one more integrated circuit 170 of the series chain looping the series chain into a looped chain, the initial scan chain further including the first scan chain input port 103 by default coupled with the integrated circuit output port 172 of the one more integrated circuit, the end scan chain further including the first scan chain output port 164 by default coupled with the integrated circuit input port 171 of the one more integrated circuit, input and output multiplexors 178, 179, 118, 119 coupling the input and output integrated circuit ports of the integrated circuits adjacent to the initial scan chain and coupling of the input and output ports of the integrated circuits in the same way as described above. Extending the above introduced numbering of the integrated circuits and the input and output multiplexors the functioning of the input and output multiplexors of the second integrated circuit can be formulated as follows: the output multiplexor $MC\_OUT_i$ couples the integrated circuit output port IC_OUT of the $IC_i$ with the first scan chain input port SC_IN1 of the $SC_{i+1}$ in the default state of the output multiplexor $MC\_OUT_i$, the output multiplexor $MC\_OUT_i$ decouples the first scan chain input port SC_IN1 of the $SC_{i+1}$ from the integrated circuit output port IC_OUT of the $IC_i$ and couples it to the integrated circuit output port IC_OUT of the $IC_{i-1}$ in the bypass state of the output multiplexor $MC\_OUT_i$, the input multiplexor $MC\_IN_i$ couples the integrated circuit input port IC_IN of the $IC_i$ with the first scan chain output port SC_OUT1 of the $SC_i$ in the default state of the input multiplexor $MC\_IN_i$, the input multiplexor $MC\_IN_i$ decouples the integrated circuit input port IC_IN of the $IC_i$ from the first scan chain output port of the $SC_i$ and couples it with the first scan chain output port of the $SC_{i-1}$ in the bypass state of the input multiplexor $MC\_IN_i$, wherein $1<i<n$.

Since the integrated circuits and the scan chains are looped in the second chip, it has an important advantage over the first integrated circuit chip. As it will be clearly seen form the following description the initial scan chain and the end scan chain have to be fully operational (or comply with the scan chain test) in order to enable testing of all integrated circuits of the first integrated circuit chip. On the contrary, just any two scan chains have to be fully operational (or comply with the scan chain test) in order to enable testing of all integrated circuits of the second integrated circuit chip.

Unless specially mentioned the following description further refers to both integrated circuit chips, whose circuit diagrams are depicted on the FIGS. 1*a-b* and 2*a-b*.

The integrated circuit input ports, the integrated circuit output ports, the first scan chain output ports, and the first scan chain input ports may be parallel ports and the first scan chain input and output ports may be serial ports.

Each scan chain operates by generating a scan chain output electrical signal on the second scan chain output port of the scan chain in response to receiving a scan chain input electrical signal on the second scan chain input port of the scan chain. Each integrated circuit operates by generating an output integrated circuit electrical signal on the circuit output port of the integrated circuit in response to receiving an input integrated circuit electrical signal on the input port of the integrated circuit. Each scan chain except the end one of the first integrated circuit chip is further operated for generating the input integrated circuit electrical signal on the first scan chain output port of the scan chain in the response to the receiving the scan chain input electrical signal on the second scan chain input port of the scan chain. Each scan chain except the initial one of the first integrated circuit chip is further operated for generating of a processed integrated circuit output electrical signal on the second scan chain output port of the scan chain in response to receiving of the output integrated circuit electrical signal on the first scan chain input port of the scan chain. Each scan chain may be further operated for generating the scan chain output electrical signal on the second scan chain output port of the scan chain in response to receiving the scan chain output electrical signal on the second scan chain input port of the scan chain.

The multiplexor circuitry operates for: bypassing any first portion of the series chain beginning with the first bypassed scan chain and ending with the last bypassed integrated circuit wherein the integrated circuit output port of the integrated circuit adjacent to the first bypassed scan chain is coupled with the first scan chain input port of the scan chain adjacent to the last bypassed integrated circuit and the first scan chain input port of the scan chain adjacent to the last bypassed integrated circuit is decoupled from the integrated circuit output port of the last bypassed integrated circuit; and bypassing any second portion of the series chain beginning with the first bypassed integrated circuit and ending with the last bypassed scan chain wherein the integrated circuit input port of the integrated circuit adjacent to the last bypassed scan chain is coupled with the first scan chain output port of the scan chain adjacent to the first bypassed integrated circuit and the integrated circuit input port of the integrated circuit adjacent to the last bypassed scan chain is decoupled from the first scan chain output port of the last bypassed scan chain.

Bypassing any second portion is performed by switching all the input multiplexors of a respective second set of the input multiplexors into the bypass state, wherein each first scan chain output port of the respective bypassed scan chain of any second portion coupled by way of the respective input multiplexor of the respective second set with the respective integrated circuit input port of the integrated circuit adjacent to the respective bypassed scan chain in the default state of the respective input multiplexor. This may be formulated using the above introduced numbering of the elements of the first and second integrated circuit chip as follows: bypassing of the second portion beginning with the first bypassed integrated circuit $IC_i$ and ending with the last bypassed scan chain $SC_j$ is performed by switching in the bypass state all input multiplexors $MC\_IN_k$, wherein i<k≤j for the first integrated circuit chip and for the second integrated chip when i<j, i<k≤n and 1≤k≤j for the second integrated circuit chip when i>j.

The bypassing of any first portion is performed by switching all output multiplexors of a respective first set of the output multiplexors into the bypass state, wherein each integrated circuit output port of the respective bypassed integrated circuit of any first portion is coupled by way of the respective output multiplexor of the respective first set with the respective first scan chain input port of the respective scan chain adjacent to the respective bypassed integrated circuit in the default state of the respective output multiplexor. This may be formulated using the above introduced numbering of the elements of the first and second integrated circuit chip as follows: bypassing first portion beginning with the first bypassed scan chain $SC_i$ and ending with the last bypassed integrated circuit $IC_j$ is performed by switching in the bypass state all output multiplexors $MC\_OUT_k$, wherein i≤k≤j for the first integrated circuit chip and for the second integrated chip when i≤j, i≤k≤n and 1≤k≤j for the second integrated circuit chip when i>j.

The multiplexor circuitry may be further operated for coupling the input terminal with any second scan chain input port, and coupling the output terminal with any second scan chain output port.

The coupling of the input terminal with any second scan chain input port except the second scan chain input port of the initial scan chain is performed by switching a respective third set of the signal multiplexors into the bypass state. Each signal multiplexor of the respective third set couples in the default state the respective second scan chain input port of the scan chain of the fifth set with the respective second scan chain output port of the scan chain of the fifth set. The fifth set includes the initial scan chain, the scan chain including any second scan chain input port, and all the scan chains located in the series chain between the initial scan chain and the scan chain including any second scan chain input port. This may be formulated using the above introduced numbering of the elements of the first and second integrated circuit chip as follows: coupling of the input terminal with the second scan chain input port of the $SC_i$ is performed by switching all signal multiplexors $M_k$ in the bypass state, wherein 1<i<n and 1≤k<i.

The coupling of the output terminal with any second scan chain output port except the second scan chain output port of the end scan chain is performed by switching a respective fourth set of the signal multiplexors into the bypass state. The fourth set s the additional signal multiplexor and all signal multiplexors coupling in the default state the respective first scan chain input and output ports of the scan chains located in the series chain between the end scan chain and the scan chain including any second scan chain output port. This may be formulated using the above introduced numbering of the elements of the first and second integrated circuit chip as follows: coupling of the output terminal with the second scan chain input port of the $SC_i$ is performed by switching all signal multiplexors $M_k$ in the bypass state, wherein 1<i<n and i<k<n.

The multiplexor circuitry may be further operated for coupling the second scan chain output port of at least one scan chain except the end scan chain with the output terminal by way of a second set of the scan chains and/or coupling the second scan chain input port of the at least one scan chain except the initial scan chain with the input terminal by way of a first set of the scan chains. The at least one scan chain and all the scan chains of the second set of the scan chains are coupled sequentially in a second auxiliary series chain of the scan chains by way of second respective number of coupled pairs of the second scan chain input and output ports of the scan chains adjacent to each other in the second auxiliary series chain. The second auxiliary series chain begins with the at least one scan chain having second scan chain output port coupled with the second scan chain input port of the scan chain adjacent to the at least one scan chain in the second auxiliary series chain. The second auxiliary series chain ends with the scan chain of the second set of the scan chains having second scan chain output port coupled with the output terminal. The at least one scan chain and all the scan chains of the first set of the scan chains are coupled sequentially in a first auxiliary series chain of the scan chains by way of a first respective number of coupled pairs of the second scan chain input and output ports of the scan chains adjacent to each other in the firstauxiliary series chain. The firstauxiliary series chain ends with the at least one scan chain having second scan chain input port coupled with the second scan chain output port of the scan chain adjacent to the at least one scan chain in the firstauxiliary series chain. The first auxiliary series chain begins with the scan chain of the first set of the scan chains having second scan chain input port coupled with the output terminal. This may be formulated using the above introduced numbering of the elements of the first and second integrated circuit chip as follows: coupling the second scan chain output port of the scan chain $SC_i$ with the output terminal by way of a second set of the scan chains $SC_{i+1}$-$SC_j$ is performed by switching multiplexors $M_k$ in the default state, wherein $0<i<n$, $i<j\leq n$, $i\leq k\leq j$; coupling the second scan chain input port of the scan chain $SC_m$ with the input terminal by way of a first set of thescan chains $SC_s$-$SC_{m-1}$ is performed by switching multiplexors $M_1$ in the default state, wherein $1<m\leq n$, $1\leq s<m$, $s\leq 1\leq m$.

FIG. 3 illustrates a flowchart of process blocks for testing of the aforementioned integrated circuit chips. The testing is ort to be understood in the following description in a broadest possible sense. The testing may include coupling the input and output terminals of the integrated circuit chips with various testing tools operated for coupling one or more sources electrical signals with the input and output terminals and registering the electrical signals generated by the integrated circuits on the input and output terminals. The testing may further include causing the multiplexor circuitry provide various test patterns during testing by switching the above described multiplexors between the bypass and default states.

The testing begins with a process block 200 (FIG. 3a), wherein one not yet tested scan chain is selected. In a process block 202 the second scan chaininput port of the selected scan chain is coupled with an external source of the scan chain input electrical signal and the second scan chain output port of the selected scan chain with an external testing system operated for determining whether the scan chain complies with the scan chain test on a basis of the received scan chain output electrical signal of the scan chain. The coupling of the external test system with the second scan chain output port of the selected scan chain may be performed by way of the output terminal. The coupling of the external source of the scan chain input electrical signal with the second scan chain input port may be performed by way of the input terminal. In a process block 204 the selected scan chain is put to the scan chain test. The external testing system receives the scan chain output electrical signal of the scan chain under the scan chain test and determines whether the scan chain complies with the scan chain test. In a case when the selected scan chain complies with the scan chain test a number of the scan chains complying with the scan chain test is incremented by unity, wherein the number was set to zero before execution of the flowchart. In a decision process block 206 the number of the scan chains complying with the scan chain test is compared against a predetermined number of the scan chains complying with the scan chain test. If the number equals the predetermined number then a process block 207 (FIG. 3a) is executed; otherwise a decision process block 208 is executed. The predetermined number has to be greater than unity and not greater than overall number of the scan chains of the integrated circuit chip. The exact value of the predetermined number may be determined by the objective of the test program for testing the integrated circuit chip. For instance when it is known that a defect density is low and the objective of the test program is to test just a few elements of the integrated circuit chip, then the predetermined number may be set to 2. In another example, when the objective of the test program is a complete test of all elements of the integrated circuit chip, then the condition of the decision process block 206 may be formulated in a way enabling testing of all the scan chains. For instance, in the decision process block 206 the flowing criteria have to be fulfilled in order to enable execution of the process block 207: all the scan chains have to be tested and the number has to be not less than the predetermined number. In a decision process block the process blocks 200, 202, 204 and the decision process block 206 are looped until all the scan chains are tested. In a case when all the scan chains are tested execution of the decision process block 208 causes execution of a process block 209. In the process block 209 test results generated by the test program are stored and the test program is ended.

The testing of the scan chains may be performed by testing the scan chains in parallel. For instance a portion or all signal multiplexors may be set to a default state and the rest of the signal multiplexors may be set to bypass state during testing of the scan chains. In this case all the scan chains having the same numbers as the signal multiplexors set to the default state are put to the scan chain test simultaneously. The external system is further operated for to determine whether all the scan chains simultaneously put to the scan chain test comply with the scan chain test. In order to implement this way of testing a new test set of not yet san chains is selected in the process block 200. In the process block 202 the following is performed: the external source of the scan chain input electrical signal is coupled with the input terminal, the external testing system is coupled with the output terminal, all signal multiplexors having the same numbers as the scan chains of the test set are set to default state and all other signal multiplexors are set to the bypass state. In the process block 204 all the scan chains of the new test set are simultaneously put to the scan chain test. In a case when all the scan chains of the new test set comply with the scan chain test the number is incremented by the number of the scan chains in the new test set. The execution of the decision process block 206 is performed in a similar way as described above. In the decision process block 208 the process blocks 200, 202, 204 and the decision process block 206 are looped until all test sets are tested. When all test sets are tested execution of the decision process block 208 causes execution of the process block 209 (FIG. 3a) as previously described.

In the process block 207 the testing program is generated and/or updated and/or modified. The test program for testing of the integrated circuit includes the following test pattern: a list of one or more input-output pairs of the scan chains, one or more respective test portions of the series chain, and one or more respective sets of the integrated circuits, wherein each input-output pair has one respective test portion and one respective set of integrated circuits. Each input-output pair consists of two scan chains complying with the scan chain test. Each input-output pair is selected wherein the first scan chain output port of the input scan chain of the next input-output pair is coupled by default with the integrated circuit input port of the integrated circuit adjacent to the input scan chain, wherein the integrated circuit adjacent to the input scan chain is the integrated circuit of a respective test portion of the series chain between the input and output scan chains of the next input-output pair, and the first scan chain input port of the output scan chain of the next input-output pair is coupled by default with the integrated circuit output port of the integrated circuit adjacent to the output scan chain, wherein the integrated circuit adjacent to the output scan chain is the integrated circuit of the respective test portion. Each test portion has a respective set of the integrated circuits of the test portion.

A logical structure of the test patterns can be readily understood on the following examples. Suppose that the input scan chain has number 2 and the output scan chain has number 5 according to numbering of the elements of the integrated circuit chips described above. In this case the test portion includes the scan chains having numbers 3 and 4 and the integrated circuits having numbers 2, 3, and 4. The set of the integrated circuits of the test portion may be any set of the scan chains consisting of one, two, or three integrated circuits having numbers 2, 3, and 4. The following example is only valid for the second integrated circuit chip. Suppose that the input scan chain has number 5 and the output scan chain has number 2 according to numbering of the elements of the integrated circuit chips described above. In this case the test portion includes the scan chains having numbers 1 and from 6 to n and the integrated circuits having numbers 1 and from 5 to n. The set of the integrated circuits of the test portion may be any set of the scan chains consisting of any of one or more integrated circuits having numbers 1 and 5 to n.

Generation of the test patterns may be determined by particular tasks of the testing programs. For instance, when delay of electrical signals in the input and output multiplexors and related circuits is crucial, then utilization of the input and output multiplexors in the bypass state has to be minimized. This can be achieved by testing all the scan chains and selecting of the test portions in way that they do no include any scan chains complying with the scan chain test. In this case the lengths of wiring and a number of input-output multiplexors coupling the integrated circuit input and output ports with the second scan chain input and output ports are minimized With independent of an aforementioned example an important constrain for generation of the test patterns may be a requirement that no integrated circuits are tested twice using the same input-output pair.

In a process block 210 (FIG. 3*b*), a next input-output pair of the scan chains is elected according to the test program. In a process block 211 the external source of the scan chain electrical signal is coupled with the second scan chain input port of the input scan chain of the next input-output pair and the external testing system is coupled with the second scan chain output port of the output scan chain of the next input-output pair.

In a process block 212 one not yet tested integrated circuit of the respective set of the integrated circuits is selected according to the test pattern of the test program. In a case when the selected integrated circuit is adjacent to the output scan chain a decision process block 213 causes execution of another decision process block 215, otherwise the decision process block 213 causes execution of a process block 214. In the process block 214 a first portion of the series chain located between the output scan chain and the selected integrated circuit test is bypassed wherein the first scan chain input port of the output scan chain is coupled with the integrated circuit output port of the selected integrated circuit and the first scan chain input port of the output scan chain is decoupled from the integrated circuit output port of the integrated circuit adjacent to the output scan chain. The decision process block 215 is executed after the process block 214.

Functioning of the process block 214 can be readily understood on the following example. Suppose that the input scan chain has number 2, the output scan chain has number 5, and the selected scan chain has number 2 according to numbering of the elements of the integrated circuit chips described above. In this case the first portion of the series chain includes the scan chains having numbers 3 and 4 and the integrated circuits having numbers 3 and 4. The first portion of the series chain is bypassed by stetting the output multiplexors having numbers 3 and 4 into a bypass state.

In a case when the selected integrated circuit is adjacent to the input scan chain a decision process block 215 causes execution of the process block 216, otherwise the decision process block 215 causes execution of a process block 217. In the process block 216 a second portion of the series chain located between the input scan chain and the selected integrated circuit is bypassed wherein the first scan chain output port of said input scan chain is coupled with the integrated circuit input port of the selected integrated circuit under the integrated circuit test and the integrated circuit input port of the selected integrated circuit is decoupled from the first scan chain output port of the scan chain adjacent to the integrated circuit. The process block 217 is performed after the process block 216 (FIG. 3*b*).

Functioning of the process block 216 can be readily understood on the following example. Suppose that the input scan chain has number 2 and the output scan chain has number 5 according to numbering of the elements of the integrated circuit chips described above. The selected integrated circuit under the integrated circuit test has a number 3. In this case the second portion of the series chain includes the scan chain having numbers 3 and the integrated circuit having numbers 2. The second portion of the series chain is bypassed by stetting the input multiplexor having number 3 into a bypass state.

In the process block 217 the selected integrated circuit is put to an integrated circuit test, wherein the external source of the scan chain input electrical signal is coupled with the second scan chain input port of the input scan chain of the next selected input-output pair, as a reaction on the receiving of the scan chain input electrical signal on the second scan chain input port of the input scan chain the input scan chain generates the input integrated circuit electrical signal on the first scan chain output port of the input scan chain, as a reaction on the receiving of the input integrated circuit electrical signal on the integrated circuit input port of the integrated circuit under the integrated circuit test the integrated circuit generates the output integrated circuit electrical signal on the circuit output port of the integrated circuit, as a reaction on receiving of the output integrated circuit electrical signal on the first scan chain input port of the output scan chain the output scan chain generates the processed integrated circuit output electrical signal on the second scan chain output port of the output scan chain, the processed integrated circuit output electrical signal is registered by the external testing system further operated for registering the processed integrated circuit output electrical signal of the scan chain having first scan chain input port coupled with the integrated circuit output port of the integrated circuit under the integrated circuit test.

In a case when not all integrated circuits of the set of the integrated circuits corresponding to the selected next input-output pair of the test pattern are tested by putting them at the integrated circuit test a process block 218 loops execution of the decision process blocks 213, 215 and the process blocks 212, 217, otherwise execution of the process block 218 causes execution of another decision process block 221 (FIG. 3b).

In a case when the test program is not completed execution of the decision process block 221 loops execution of the decision process blocks 213, 215, 218 and the process blocks 210, 211, 212, 217, otherwise execution of the decision process block 221 causes execution of the process block 209. Various criteria may be used for assessment of the completion of the test program. For instance the test program may be completed when all tests according to the test patterns are performed. Alternatively the test program may be completed when the external test system have registered sufficient amount of the processed integrated circuit output electrical signals generated by one or more output scan chains, whose first scan chain input ports were coupled with one or more integrated circuits under the integrated circuit test. Yet another criterion for completing the test program may be when the external test system have registered sufficient amount of the processed integrated circuit output electrical signals complying with one or more integrated circuit test criteria, wherein the processed integrated circuit output electrical signals were generated by output scan chains, whose first scan chain input ports were coupled with one or more integrated circuits under the integrated circuit test.

The test program may be modified/updated during its execution. In particular the test pattern may be modified/updated/generated during execution of the test program. After determining that at least two scan chains comply with the scan chain test in the decision process block 207 the test pattern is generated using at least two scan chins complying with the scan chain test. Modification of the test pattern generated in the process block 207 is enabled by introducing into the flow chart at least one of decision process blocks 219 and 220. One or both of decision process blocks 219, 220 and the process block 218 may be executed in any arbitrary order. The test program may include process blocks requesting an increase of a number of the identified scan chains complying with the scan chain test and/or modification of the test program and/or test pattern of the test program. This request may be performed on a basis of analysis of the processed integrated circuit output electrical signals registered by the external testing system. In case when the number of the scan chains complying with the scan chain test needs to be increased and not all the scan chains are tested by putting them to the scan chain test execution of the decision process block 219 causes restart of execution of the flowchart starting with the process block 200, otherwise execution of the decision process block 219 causes execution of the next following (decision) process block, depending on a particular implementation the next following process block may be but is not limited to one of the following process blocks (FIG. 3b) 217, 218, 220, and 221. In a case when the modification/update of the test program and/or test pattern is requested execution of the decision process block 220 causes restart of the execution of the flow chart starting with the process block 207, otherwise execution of the decision process block 220 causes execution of the next following (decision) process block, depending on a particular implementation the next following process block may be but is not limited to one of the following (decision) process blocks 217, 218, 220, and 221.

The description of the present invention has been presented for illustrative purposes, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A chip comprising at least two integrated circuits, at least three scan chains, and a multiplexor circuitry, each integrated circuit comprising an input port and an output port, the scan chains and the integrated circuits are coupled in a series chain with the integrated circuits and the scan chains alternating each other, the series chain beginning with an initial scan chain and ending with an end scan chain, wherein each scan chain comprises a first scan chain input port and a first scan chain output port, the first scan chain input port of each scan chain, except the initial scan chain, is coupled with the output port of a preceding integrated circuit in the series chain, the first scan chain output port of each scan chain, except the end scan chain, is coupled with the input port of a successive integrated circuit in the series chain, the multiplexor circuitry comprising:

using a computer, bypassing a first portion of the series chain beginning with a first bypassed scan chain and ending with a last bypassed integrated circuit wherein the output port of the integrated circuit preceding the first bypassed scan chain is coupled with the first scan chain input port of the scan chain succeeding the last bypassed integrated circuit and the first scan chain input port of the scan chain succeeding the last bypassed integrated circuit is decoupled from the output port of the last bypassed integrated circuit; and bypassing a second portion of the series chain beginning with a first bypassed integrated circuit and ending with a last bypassed scan chain wherein the input port of the integrated circuit adjacent to the last bypassed scan chain is coupled with the first scan chain output port of the scan chain adjacent to the first bypassed integrated circuit and the input port of the integrated circuit adjacent to the last bypassed scan chain is decoupled from the first scan chain output port of the last bypassed scan chain.

2. The chip of claim 1, wherein the chip further comprises:

one more integrated circuit looping the series chain into a looped chain, wherein the first scan chain input port of the initial scan chain is coupled with the output port of the one more integrated circuit, and the first scan chain output port of the end scan chain is coupled with the input port of the one or more integrated circuit.

3. The chip of claim 1, wherein each scan chain comprises a second scan chain input port and a second scan chain output port, each scan chain generates a scan chain output electrical signal on the second scan chain output port of the scan chain in response to receiving a scan chain input electrical signal on the second scan chain input port of the scan chain, each integrated circuit generates an output integrated circuit electrical signal on the output port of the integrated circuit in response to receiving an input integrated circuit electrical signal on the input port of the integrated circuit, each scan chain except the end scan chain generates the input integrated circuit electrical signal on the first scan chain output port of the scan chain in the response to the receiving the scan chain input electrical signal on the second scan chain input port of the scan chain, each scan chain except the initial scan chain generates a processed output electrical signal on the second scan chain output port of the scan chain in response to receiving the output integrated circuit electrical signal on the first scan chain input port of the scan chain.

4. The chip of claim 2, wherein each scan chain comprises a second scan chain input port and a second scan chain output port; each scan chain generates a scan chain output electrical signal on the second scan chain output port of the scan chain in response to receiving a scan chain input electrical signal on the second scan chain input port of the scan chain; each integrated circuit generates an output integrated circuit electrical signal on the output port of the integrated circuit in response to receiving an input integrated circuit electrical signal on the input port of the integrated circuit; each scan chain generates the input integrated circuit electrical signal on the first scan chain output port of the scan chain in response to receiving the scan chain input electrical signal on the second scan chain input port of the scan chain; each scan chain generates a processed output electrical signal on the second scan chain output port of the scan chain in response to receiving the output integrated circuit electrical signal on the first scan chain input port of the scan chain.

5. The chip of claim 1, wherein each input port of each integrated circuit in the series chain, except the integrated circuit immediately following the initial scan chain, is coupled with the first scan chain output port of a preceding scan chain in the series chain by way of an input multiplexor in a default state, and in a bypass state, each input multiplexor decouples each input port of each integrated circuit, except the integrated circuit immediately following the initial scan chain, from the first scan chain output port of the preceding scan chain and couples it to the first scan chain output port of a different scan chain in the series chain preceding a different integrated circuit in the series chain;
  wherein the different scan chain and the different integrated circuit both precede the integrated circuit in the series chain;
  wherein bypassing the second portion of the series chain comprises switching the input multiplexor into the bypass state; and
  each output port of each integrated circuit, except the integrated circuit immediately following the initial scan chain, is coupled with the first scan chain input port of a successive scan chain in the series chain by way of an output multiplexor in a default state, and in a bypass state, each output multiplexor decouples the first scan chain input port of the successive scan chain from the each output port of each integrated circuit, except the integrated circuit immediately following the initial scan chain, and couples it to the output port of the different integrated circuit succeeding the different scan chain; and
  wherein bypassing the first portion of the series chain comprises switching the output multiplexor into the bypass state.

6. The chip of claim 2, wherein each input port of each integrated circuit in the series chain is coupled with the first scan chain output port of a preceding scan chain in the series chain by way of an input multiplexor in a default state, and in a bypass state, each input multiplexor decouples each input port of each integrated circuit from the first scan chain output port of the preceding scan chain and couples it to the first scan chain output port of a different scan chain in the series chain preceding a different integrated circuit in the series chain,
  wherein the different scan chain and the different integrated circuit both precede the integrated circuit in the series chain;
  wherein bypassing the second portion of the series chain comprises switching the input multiplexor into the bypass state; and
  each output port of each integrated circuit is coupled with the first scan chain input port of a successive scan chain in the series chain by way of an output multiplexor in a default state, and in a bypass state, each output multiplexor decouples the first scan chain input port of the successive scan chain from each output port of each integrated circuit and couples it to the output port of the different integrated circuit succeeding the different scan chain; and
  wherein bypassing the first portion of the series chain comprises switching the output multiplexor into the bypass state.

7. The chip of claim 3, wherein the chip further comprises:
  an input terminal and an output terminal for coupling the chip with external electronic devices, the multiplexor circuitry couples the input terminal of the chip with any second scan chain input port; and couples the output terminal of the chip with any second scan chain output port.

8. The chip of claim 7, wherein the second scan chain input port of the initial scan chain is coupled with the input terminal, the second scan chain output port of the initial scan chain is coupled with the second scan chain input port of a successive scan chain by way of an initial signal multiplexor in a default state, and in a bypass state, the initial signal multiplexor decouples the second scan chain input port of the successive scan chain from the second scan chain output port of the initial scan chain and couples it with the second scan chain input port of the initial scan chain;
  wherein each second scan chain input port of each scan chain, except the initial scan chain, is coupled with the second scan chain output port of a preceding scan chain by way of a signal multiplexor in a default state, and in a bypass state, each signal multiplexor decouples each second scan chain input port of each scan chain, except the initial scan chain, from the second scan chain output port of the preceding scan chain and couples it to the second scan chain input port of the preceding scan chain; and
  wherein the output terminal of the chip is coupled with the second scan chain output port of the end scan chain by way of an end signal multiplexor in a default state, and in a bypass state, the end signal multiplexor decouples the output terminal of the chip from the second scan chain output port of the end scan chain and couples it with the second scan chain input port of the end scan chain.

9. The chip of claim 3, wherein the input ports, the output ports, the first scan chain output ports, and the first scan chain input ports are parallel ports.

10. A method for testing integrated circuits of a chip comprising at least two integrated circuits, at least three scan chains, and a multiplexor circuitry, each integrated circuit comprising an input port and an output port, the scan chains and the integrated circuits are coupled in a series chain with the integrated circuits and the scan chains alternating each other, the series chain beginning with an initial scan chain and ending with an end scan chain, wherein each scan chain comprises a first scan chain input port and a first scan chain output port, the first scan chain input port of each scan chain, except the initial scan chain, is coupled with the output port of a preceding integrated circuit in the series chain, the first scan chain output port of each scan chain, except the end scan chain, is coupled with the input port of a successive integrated circuit in the series chain, the method comprising:

selecting a test portion of the series chain comprising the scan chains and the integrated circuits of the series chain between an input scan chain and an output scan chain, the first scan chain output port of the input scan chain is coupled with the input port of the integrated circuit immediately succeeding the input scan chain, and the first scan chain input port of the output scan chain is coupled with the output port of the integrated circuit immediately preceding the output scan chain;

applying an integrated circuit test to each of the integrated circuits of the test portion, wherein the output port of each integrated circuit undergoing the integrated circuit test is coupled with the first scan chain input port of the output scan chain and the input port of each integrated circuit undergoing the integrated circuit test is coupled with the first scan chain output port of the input scan chain, wherein applying the integrated circuit test to each of the integrated circuits of the test portion comprises causing the multiplexor circuitry to perform:

bypassing a first portion of the series chain comprising the scan chains and the integrated circuits located between the output scan chain and the integrated circuit undergoing the integrated circuit test, wherein the first scan chain input port of the output scan chain is coupled with the output port of the integrated circuit undergoing the integrated circuit test and the first scan chain input port of the output scan chain is decoupled from the output port of the integrated circuit immediately preceding the output scan chain; and bypassing a second portion of the series chain comprising the scan chains and the integrated circuits located between the input scan chain and the integrated circuit undergoing the integrated circuit test, wherein the first scan chain output port of the input scan chain is coupled with the input port of the integrated circuit undergoing the integrated circuit test and the input port of the integrated circuit undergoing the integrated circuit test is decoupled from the first scan chain output port of the scan chain immediately preceding the integrated circuit undergoing the integrated circuit test.

11. The method of claim 10, wherein each scan chain comprises a second scan chain input port and a second scan chain output port, the method further comprising:

applying a scan chain test to each scan chain in the series chain to identify at least two scan chains complying with the scan chain test until either the at least two scan chains complying with the scan chain test are identified or until all the scan chains of the series chain are tested, wherein each scan chain generates a scan chain output electrical signal on the second scan chain output port of the scan chain in response to receiving a scan chain input electrical signal on the second scan chain input port of the scan chain, wherein applying the scan chain test comprises coupling the second scan chain input port of the scan chain undergoing the scan chain test with an external source and the second scan chain output port of the scan chain undergoing the scan chain test with an external testing system operated for determining compliance with the scan chain test based on the scan chain output electrical signal; wherein the input scan chain and the output scan chain both comply with the scan chain test.

12. The method of claim 11, wherein each integrated circuit of the test portion generates an integrated circuit output electrical signal on the output port of the integrated circuit in response to receiving an integrated circuit input electrical signal on the input port of the integrated circuit, wherein each scan chain of the test portion complying with the scan chain test, except output scan chain, further generates the input integrated circuit electrical signal on the first scan chain output port of the scan chain in response to receiving the scan chain input electrical signal on the first scan chain input port of the scan chain, each scan chain of the test portion complying with the scan chain test, except the input scan chain, is further operated for generating a processed integrated circuit output electrical signal on the second scan chain output port of the scan chain in response to receiving the output integrated circuit electrical signal on the first scan chain input port of the scan chain, the method further comprising:

before applying the integrated circuit test to each of the integrated circuits of the test portion, coupling the second scan chain input port of the input scan chain with the external source of the scan chain input electrical signal and the second scan chain output port of the output scan chain of the next input-output pair with the external testing system, wherein the external testing system is further operated for registering the processed integrated circuit output electrical signal of the scan chain having its first scan chain input port coupled with the output port of the integrated circuit undergoing the integrated circuit test, wherein applying the integrated circuit test to each of the integrated circuits of the test portion comprises registering of the processed integrated circuit output electrical signal by the external testing system.

13. The method of claim 12, wherein the chip further comprises one more integrated circuit looping the series chain into a looped chain, the initial scan chain further comprises the first scan chain input port of the initial scan chain is coupled with the output port of the one more integrated circuit, the end scan chain further comprises the first scan chain output port of the end scan chain is coupled with the input port of the one more integrated circuit, wherein the end scan chain is further operated for generating the integrated circuit input electrical signal on the first scan chain output port of the scan chain in response to receiving the scan chain input electrical signal on the second scan chain input port of the scan chain and the initial scan chain further operated for generating of the processed output electrical signal on the second scan chain output port of the scan chain in response to receiving the integrated circuit output electrical signal on the first scan chain input port of the scan chain.

14. The method of claim 11, wherein the second scan chain output port of at least one scan chain undergoing the scan chain test is coupled with the external testing system by way of a second set of the scan chains undergoing the scan chain test and the second scan chain input port of the at least one scan chain undergoing the scan chain test is coupled with the external source of the scan chain input electrical signal by way of a first set of the scan chains undergoing the scan chain test;

wherein the at least one scan chain undergoing the scan chain test and all the scan chains of the second set of the scan chains are coupled sequentially in a second auxiliary series chain of the scan chains undergoing the scan chain test by way of a second respective number of coupled pairs of the second scan chain input port and the second scan chain output port of the scan chains adjacent to each other in the second auxiliary series chain, wherein the second auxiliary series chain begins with the at least one scan chain under the scan chain test having second scan chain output port coupled with the second scan chain input port of the scan chain adjacent to the at least one scan chain under the scan chain test in the second auxiliary series chain, wherein the second auxiliary series chain ends with the scan chain of the second set of the scan chains having second scan chain output port coupled with the external testing system, wherein the external test system is further operated for testing all the scan chains in the second auxiliary series chain simultaneously and determining whether all the scan chains in the second auxiliary series chain comply with the scan chain test; and wherein the at least one scan chain under the scan chain test and all the scan chains of the first set of the scan chains are coupled sequentially in a first auxiliary series chain of the scan chains under the scan chain test by way of a first respective number of coupled pairs of the second scan chain input port and the second scan chain output port of the scan chains adjacent to each other in the first auxiliary series chain, wherein the first auxiliary series chain ends with the at least one scan chain under the scan chain test having second scan chain input port coupled with the second scan chain output port of the scan chain adjacent to the at least one scan chain under the scan chain test in the first auxiliary series chain, wherein the first auxiliary series chain begins with the scan chain of the first set of the scan chains having the second scan chain input port coupled with the external source of the scan chain input electrical signal, wherein the external test system is further operated for testing all the scan chains in the first auxiliary series chain simultaneously and determining whether all the scan chains in the first auxiliary series chain comply with the scan chain test.

15. The method of claim 12, further comprising:
selecting a test portion of the series chain comprising the scan chains and the integrated circuits of the series chain between an input scan chain and an output scan chain, repeating one or more times selecting another test portion of the series chain and applying an integrated circuit test to each of the integrated circuits of the another test portion, wherein subsequent test portions comprises at least one integrated circuit that was not previously tested, and further comprising testing all scan chains in the series chain prior to selecting the another test portion.

16. A non-transitory program storage device readable by a machine, tangibly embodying a program of instructions executable by the machine to perform method steps for a chip comprising at least two integrated circuits, at least three scan chains, and a multiplexor circuitry, each integrated circuit comprising an input port and an output port, the scan chains and the integrated circuits are coupled in a series chain with the integrated circuits and scan chains alternating each other, the series chain beginning with an initial scan chain and ending with an end scan chain, wherein each scan chain comprises a first scan chain input port and a first scan chain output port, the first scan chain input port of each scan chain, except the initial scan chain, is coupled with the output port of a preceding integrated circuit in the series chain, the first scan chain output port of each scan chain, except the end scan chain, is coupled with the input port of a successive integrated circuit in the series chain, the method comprising steps for:

using a computer, bypassing a first portion of the series chain beginning with a first bypassed scan chain and ending with a last bypassed integrated circuit wherein the output port of the integrated circuit preceding the first bypassed scan chain is coupled with the first scan chain input port of the scan chain succeeding the last bypassed integrated circuit and the first scan chain input port of the scan chain succeeding the last bypassed integrated circuit is decoupled from the output port of the last bypassed integrated circuit; and bypassing a second portion of the series chain beginning with a first bypassed integrated circuit and ending with a last bypassed scan chain wherein the input port of the integrated circuit adjacent to the last bypassed scan chain is coupled with the first scan chain output port of the scan chain adjacent to the first bypassed integrated circuit and the input port of the integrated circuit adjacent to the last bypassed scan chain is decoupled from the first scan chain output port of the last bypassed scan chain.

\* \* \* \* \*